May 15, 1962 D. P. FOUDRIAT, JR 3,034,930

PRINTED CIRCUIT PROCESS

Filed May 10, 1957

INVENTOR.
DONALD P. FOUDRIAT, JR.

BY Mueller & Aichele
Attys.

3,034,930

PRINTED CIRCUIT PROCESS

Donald P. Foudriat, Jr., Westchester, Ill., assignor to Motorola, Inc., Chicago, Ill., a corporation of Illinois Filed May 10, 1957, Ser. No. 658,463
5 Claims. (Cl. 117—212)

Figure 1:
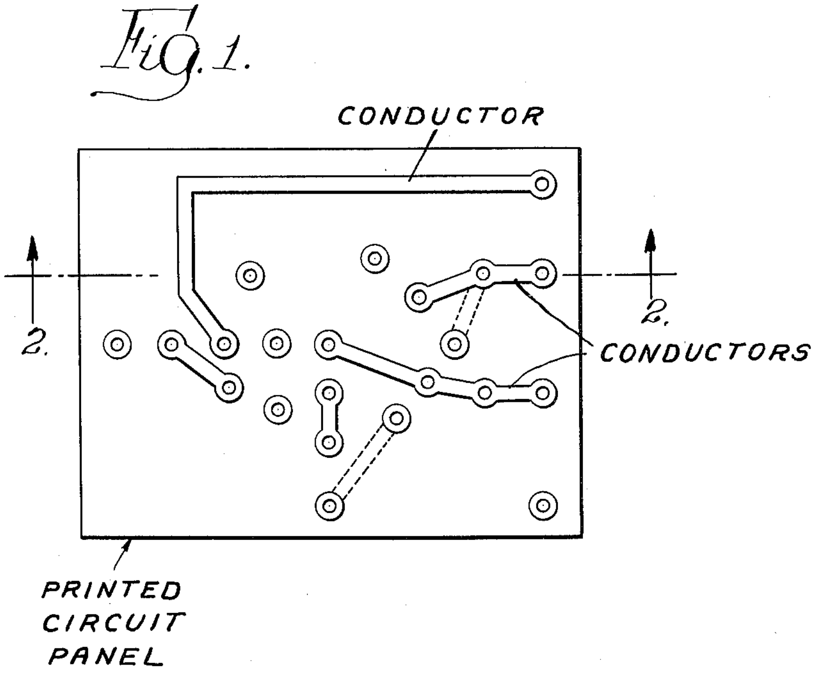

The present invention relates to plated or printed processes and assemblies, and more particularly to the application of a coating or film over a printed or plated circuit assembly to reduce electrical leakage between the conductors of the circuit and to assist in subsequent soldering operations to such conductors as well as to an improved process for applying such coating to circuit assemblies having a pattern of holes therein to prevent undesired blocking of the holes by the coating while, at the same time, providing a uniform coating.

The present application is a continuation-in-part of application Serial No. 526,573, filed August 4, 1956, and titled "Printed Circuit Process," now abandoned.

The use of plated or printed circuits in the electronic industry has become widespread in recent years. The reason for this is apparent since it enables many time-consuming and cumbersome manual operations such as the connecting and soldering of jumper connections between various electrical and electronic components to be eliminated. The use of printed circuits has proved to be an important step toward the goal of the electronic industry, that is, complete mechanization.

As was to be expected, many problems have arisen in the development of the printed circuit art, and it was essential that these problems be solved before the various printed circuit techniques could be placed on a commercial practical basis. One of these problems was the difficulty of providing firm adhesion between the electrical conductors and the insulating panel. In certain processes, such as those described in Nieter Patents 2,699,424 and 2,699,425, which issued January 11, 1955, the surface of the insulating panel was sand-blasted or otherwise roughened to improve its adhesive properties. Although this expedient has been found to improve adhesion materially, it has also been found under certain circumstances to cause some moisture absorption in the roughened surface. This absorption increases the tendency for electrical leakage in the assembly between the various conductors of the conductive design.

A moisture-repelling film or coating has been formed in the past over the plated or printed circuit assembly. This coating extends over the panel and over the conductors formed thereon, to provide somewhat of a moisture-proof package. Moreover, the film has the characteristics of melting and generating flux vapor in the presence of applied heat so that soldering connections could be made to various points of the circuit without the need for any further fluxing and without effecting the moisture repellent properties of the coating insofar as the other portions of the assembly are concerned.

In process such as that described above, it is important that the flux coat or film have certain specific properties. For example, it is of prime importance that the coating does not polymerize and toughen so as to become no longer susceptible to melting upon the application of heat. It is also important that the coating does not produce any tendency for solder bridging during the soldering operation whereby the applied solder spreads from desired points or areas on the circuit to undesired areas producing short-circuits. It is also desirable that films do not render the panel tacky or give them a tendency to stick together and block when stacked, especially on hot days. On the other hand, the films must not be excessively hard and brittle. Also, the coating must be such that it has no tendency to form tough films over apertures in the insulating panel so as to impede soldering in such apertures.

In the application of flux coating to printed circuit panels containing holes, it is important that the flux be applied so as to form a uniform film or coating that does not block the holes. Since the flux coating is applied to the circuit panel by means of solution containing the flux, very careful control of the viscosity of this solution must be maintained so that the solution will spread uniformly over the surface of the panel and in the bores of the holes while at the same time not filling up the holes where it may subsequently harden. The formation of a hardened flux coat filling the holes of the panel makes insertion of lead wires for components to be soldered thereto very difficult and materially slows down the assembly process.

These problems represented in prior processes and products have limited the use of printed circuit panels in the electronic art either from the standpoint of general acceptability or from the standpoint of cost.

It is, accordingly, an object of the present invention to provide an improved process for forming a film or coating on the surface of a printed or plated circuit panel assembly, which coating is impervious and repellent to moisture and which melts in the presence of heat to permit convenient soldering to any point on the circuit with the coating providing a fluxing action for such soldering.

Another object of the invention is to provide such an improved process in which the resulting flux coat has no tendency to polymerize, does not produce solder bridging, is not tacky, and yet is not excessively brittle, and has no tendency to form films over apertures in the panel.

Yet another object of the invention is to provide an improved printed circuit product which is encased in a film or coating having the desirable properties described in the preceding paragraph.

Another object of the invention is to provide an improved process for applying a flux coating to printed or plated circuit panels having holes therein so that a uniform coating is obtained while blocking of the holes in the panel by hardened flux coat is avoided.

A still further object is to provide an improved printed circuit panel which can be produced on a competitive cost basis with wired circuit constructions.

A feature of the present invention is an electronic chassis including a flat insulating panel with thin flat metallic conductors formed on at least one face thereof and conforming to a circuit pattern with a continuous, water-repellent flux coat thereon, the flux coat being formed of a water insoluble rosin and being effective to minimize electrical leakage in the chassis and to provide fluxing for subsequent soldering operations.

Another feature of the invention is the careful control of the ratio of solute to solvent in a solution into which a circuit assembly having holes therein may be dipped so that a smooth and uniform coating is obtained and blocking of the holes by the flux coating material is avoided.

A still further feature of the invention is the provision of a process which provides an acceptable printed circuit panel both in quality and cost.

Figure 2:
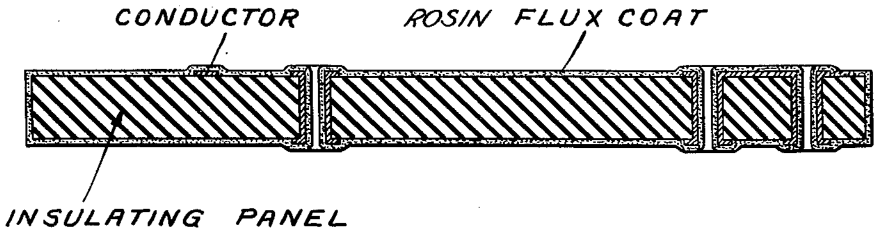

Referring now to the drawings:

FIG. 1 is a plan view of a typical printed circuit panel containing a pattern of holes and being protected with a water-repellent flux coating; and FIG. 2 is a view in section taken on the line 2—2 of FIG. 1.

The invention provides a process for finish-coating an electrical chassis of the type which includes an insulating base having metallic conductors in a predetermined circuit pattern formed thereon. The process includes applying a coating to the panel in a solution of rosin having a weight ratio of solute to solvent in the order of 40:60 and thereafter vaporizing the solvent therefrom to form a continuous, water-repellent coating effective to minimize electrical leakage in the chassis and to flux subsequent solder connections.

According to a preferred embodiment of the invention, the solution into which the panel is dipped contains as solute a relatively low melting point rosin and a highly active relatively high melting point rosin together with a plasticizer.

One method of forming a plated assembly is disclosed and claimed in the Nieter Patent 2,699,425 referred to earlier herein. As fully described in that patent, the assembly may be formed first by roughening the surface of the insulating panel by sand-blasting or by other means. A continuous metallic base coat is then applied over the panel, and in the bores of any apertures in the panel, this coating being usually formed by a spraying-reduction process fully described in the patent. A resist is then stencil-screened over the metallic base coat in a negative pattern of the desired electric circuit and the resulting assembly is then electroplated. Metallic conductors are thereby formed over the portions of the base coat other than those covered by the resist. The resist and the portions of the base coat previously covered thereby are subsequently removed to produce the plated circuit product.

It is usual, as described in the Nieter patent, to form conductive designs on both sides of the panel, with interconnections between the designs electroplated through the apertures in the panel.

As previously described, plated circuit assemblies resulting from the process described above have proved to be satisfactory for all practical purposes. However, when the surface of the insulating base is roughened to improve the adhesion properties thereof to the electrical conductors, the insulating properties of the surface are affected to some extent so that there is a likelihood and tendency for electrical leakage between the conductors.

In accordance with the present invention, and as a final step in the manufacture of the plated or printed circuit assemblies, each assembly is dipped in or sprayed with a solution whose composition is of a type which will be described in detail hereinafter. Alternately, the solution may be roller-coated onto the assembly. This solution forms a moisture repellent film or coating over the entire surface of the assembly completely to enclose the electrical conductors formed in the insulating panel. The flux coating is also formed on the bores of the holes in the panel. As previously noted, this coating possesses certain desired properties and is eminently suitable for soldering connections to the conductors through the coating. The coating melts and provides fluxing vapor at the local areas for soldering but retains its original moisture repellent property over the other portions of the assembly.

It has been found that in applying the solution to the surface of the insulating panel, control of its viscosity is very important. This is especially true when the solution is applied to assemblies containing holes and when application is made by dipping. It is necessary that the solution spreads uniformly over the surface and that it not fill up the holes although it coats the bores of the holes. If the solution does fill up the holes, its solidification upon drying will block the holes either partially or completely and make insertion of leads of electrical components very difficult or in some cases impossible. Since it is often desired to make such insertions by automatic machinery, the production of a uniform product is essential.

In accordance with the present invention is has been found that control of the viscosity of the solution may be maintained by carefully controlling the weight ratio of solute to solvent. The solute content of the solution should be in the neighborhood of 40% by weight and more particularly in the range of 38% to 45% by weight.

This critical ratio is applicable generally to fluxing rosins and solvents therefor.

A suitable solution for use in application of the rosin flux coat by dipping or otherwise contains 40% by weight of powdered rosin and 60% by weight of amyl alcohol. The rosin employed may be a commercial grade of rosin known as "water-white." This rosin has a softening point of 169° F. measured by the A.S.T.M. ball and ring method. The amyl alcohol solvent may be technical grade and it is preferred to use a grade of alcohol containing a minimum amount of secondary and tertiary amyl alcohols.

In some applications, it has been found desirable to include a small amount of activator in the rosin as, for example, levulinic acid. The presence of this activator is not essential, but it may be useful to insure that a properly conditioned copper surface is presented to the fluxing medium. The levulinic acid, when used may be present in amounts of from 0.01% to 1% by weight of the rosin.

A preferred embodiment of the invention utilizes a combination of high and low melting point rosins together with a small amount of plasticizer. One specific method for carrying out the process of the invention utilizing this preferred composition is as follows:

A. A plated or printed circuit panel assembly is provided which has been constructed in accordance with the Nieter process described above or by any other known methods. This assembly comprises electrical conductors formed on at least one surface of insulating panel in a design conforming to a desired electric circuit.

B. The assembly is then dipped in a solution at room temperature which has the following constituents:

| | Percent by weight |
|---|---|
| Solids | 40 |
| "Staybellite 742" | 50 |
| "Dymerex" | 48 |
| "Abalyn" | 2 |
| Solvent | 60 |
| Toluene | 50 |
| Isopropanol (99% concentrated) | 40 |
| Butanol (technical grade) | 10 |

C. The assembly is then removed slowly from the solution so that the wiping action of the resulting meniscus will prevent the formation of drops, such drops usually being referred to as a result of "tear dropping."

D. The assembly is then oven dried in a gas-fired convection oven for about 12 minutes at 175° F. to vaporize the solvent and form the desired water-repellent film over the assembly.

"Staybellite 742" is a trade name of the Hercules Powder Company of Chicago for a pale colored, hydrogenated rosin having high resistance to oxidation. Its softening or melting point is relatively low, in the neighborhood of 150° F. This substance is used in the solution so that the resulting film on the printed circuit panel will repsond rapidly to soldering temperatures and vaporize and permit rapid and adequately soldered fluxed contacts. The proportion of this substance in this solution is not believed to be critical and may extend through a range in the order of 30 to 70% by weight. However, too much of this substance in the solution gives the film a tendency to become soft and sticky especially on hot days.

"Dymerex" is also a trade name of the Hercules Powder Company, and refers to a pale colored thermoplastic rosin consisting primarily of dimeric acids. It has a relatively high softening point of 282° F. This latter subsance is a highly active fluxing agent and it prevents the resulting flux coat or film on the printed circuit panel from becoming sticky under relatively high ambient temperatures. The proportion of this latter substance also is not believed to be critical, and it may vary within a range extending substantially from 28% to 68% by weight.

However, too much "Dymerex" will raise the melting point of the film and retard the soldering process.

"Abalyn" is also a trade name of the Hercules Powder Company for a plasticizer to prevent the flux coat from becoming brittle. Its proportion may vary, but it should not exceed about 7% of the solution by weight. "Abalyn" is an amber colored liquid ester. It is obtained through esterification of rosin with methyl alcohol. It may be considered to be methyl abietate since abietic acid is the major constituent of the dimeric acids which make up over 90% of rosin.

The solvents listed are merely examples and a host of suitable solvents for the rosins are available and may be used. Rosin is known to be soluble in alcohol, turpentine, toluene, and in many other solvents which may be used. The toluene is preferred largely because it is inexpensive and readily available in large quantities. The technical grade (toluol) of toluene may be used.

The isopropanol should be 99% concentrated for best results, instead of the technical grade of 91%. Technical grade butanol can be used.

The oven times and temperatures, of course, are variable, it being merely necessary to treat panels in such a way that solvents are vaporized and the flux coating is formed. However, it is desirable to hold the drying temperature below about 230° F. to prevent blistering. Instead of a convection oven, well-known infra-red drying methods can be used.

Although various elements of the solution can vary within the ranges described above, it has been found necessary that the solution have a ratio of solute to solvents in the range of about 40–60% by weight. Preferably the solids content should be kept within 38–45% by weight. If the solids proportion is increased beyond the prescribed limits, the resulting flux coat has a tendency to blister and tear-drop with resulting clogging of the holes in the printed circuit panel. If the solids proportion is decreased, insufficient flux coat is formed. Moreover, this ratio provides a non-tacky film or coating over the assembly that has no tendency to form blocking films in the apertures in the panels. Such films in the apertures, as previously noted, are troublesome in that they impede the soldering process and prevent the easy insertion of components.

The process of the invention has been used, and has been found to provide a coating having all the desirable properties previously described herein. That is, the flux coat formed in the process of this invention has no tendency to polymerize or toughen; and even after a long passage of time, the film may be readily melted upon the application of heat to provide local fluxing for the soldering operation. Moreover, the coating formed in the process of the invention has no tendency to produce solder bridging nor is it tacky at high ambient temperatures. Furthermore, the coating does not have a tendency to form films blocking the apertures in the panels with the resulting adverse effect of such films upon subsequent assembly steps.

I claim:

1. The process for finish coating an electrical chassis, which chassis includes an insulating panel having thin, flat metallic conductors formed thereon conforming to a circuit pattern, which process comprises applying to said panel a solution of relatively low melting point hydrogenated rosin, a relatively high melting point thermoplastic rosin consisting primarily of dimeric rosin acids, and a plasticizer consisting essentially of a mixture of methyl esters of rosin acids, all dissolved in a suitable solvent in a weight ratio of solute to solvent in the order of 40:60; and thereafter vaporizing said solvent from the solution applied to said panel to form a continuous water-repellent flux coat over said panel and covering said conductors; said flux coat being effective to minimize electrical leakage in said chassis and to produce fluxing for subsequent soldering operation.

2. The process according to claim 1 wherein the solute content of said solution is between about 38% and about 45% by weight.

3. An electronic chassis including a flat insulating panel having thin, flat metallic conductors formed on at least one surface thereof and conforming to a circuit pattern, said panel having a continuous water-repellent flux coat thereon and over said conductors, said flux coat being formed of a relatively low melting point hydrogenated rosin of the order of 50% by weight, a relatively high melting point thermoplastic rosin of the order of 48% by weight consisting primarily of dimeric rosin acids, and a plasticizer consisting essentially of a mixture of methyl esters of rosin acids in the order of 2% by weight, and said coating being effective to minimize electrical leakage in said chassis and to provide fluxing for subsequent soldering operations.

4. A process for finish coating an electric chassis, which chassis includes an insulating base having metallic conductors formed thereon conforming to a circuit pattern, which process comprises dipping the base in a solution of a low melting point hydrogenated rosin—50% by weight of solute, a relatively high melting point thermoplastic rosin consisting primarily of dimeric rosin acids—48% by weight of solute and a plasticizer consisting essentially of a mixture of methyl esters of rosin acids—2% by weight of solute all dissolved in a mixture of solvent comprising toluene—50% by weight, 99% isopropanol—40% by weight, and technical grade butanol—10% by weight with the ratio of solute to total solvent in said solution being in the order of 40:60 by weight; thereafter removing the base slowly from said solution; and heat drying said chassis at a temperature below about 230° F. to vaporize said solvent from said solution so as to form a continuous water-repellent flux coat over said base and covering said conductors, said flux coat being effective to minimize electrical leakage in said chassis and provide fluxing for subsequent soldering operations on the chassis.

5. A process for preparing a prefabricated circuit assembly for a soldering operation in which a mass of molten solder contacts said assembly to solder electrical components thereto, said process comprising, providing a substantially flat insulating panel having a pattern of copper material in the form of a circuit pattern on at least one surface of said panel, said panel having a plurality of apertures extending through the same with copper material on the surfaces defining such apertures, at least part of said metallic material on said panel being available for soldering connections thereto, providing a coating solution comprising essentially a major proportion of water-insoluble solder-fluxing rosin material and a minor proportion of levulinic acid material dissolved in a volatile solvent of amyl alcohol, said solution having a solute content in the range of about 38% to about 45% by weight such that said solution is of proper consistency to adhere to said panel and to the surfaces defining the apertures therethrough without blocking such apertures, dipping said panel in said coating solution and slowly withdrawing the same from said solution so as to form a solution meniscus which wipes said panel and forms a smooth uniform film of said solution adhering to said panel and to the surfaces defining said apertures therein, said film being of sufficient thickness to provide proper solder fluxing action and yet leaving said apertures open, thereafter heating said panel for a predetermined time at a drying temperature sufficiently high as to evaporate excess solvent material from said film to dry it to a non-tacky and yet non-brittle condition without blistering said film, said film as dried being readily meltable by molten solder upon contact therewith in a subsequent soldering on said panel to provide solder fluxing action, with said levulinic acid in said film being adapted to activate the underlying copper material to insure proper soldering in such soldering operation.

References Cited in the file of this patent

UNITED STATES PATENTS

| | | |
|---|---|---|
| 1,726,100 | Da Costa | Aug. 27, 1929 |
| 2,441,960 | Eisler | May 25, 1948 |
| 2,482,923 | McCoy | Sept. 27, 1949 |
| 2,715,616 | McIntosh | Aug. 16, 1955 |
| 2,830,918 | Zimmerman | Apr. 15, 1958 |

OTHER REFERENCES

Hercules: "Synthetic Resins," 1949.

Printed Circuit Techniques (National Bureau of Standards Circular 468), 1947.

Chatfied: "Treated Natural Resins," August 1946 (pp. 275 and 276).

Modern Plastics, v. 28, No. 12, August 1951 (pp. 99–111).